United States Patent [19]

Johnson et al.

[11] Patent Number: 4,853,646

[45] Date of Patent: Aug. 1, 1989

[54] TEMPERATURE COMPENSATED BIPOLAR CIRCUITS

[75] Inventors: Terry J. Johnson, Cape Elizabeth; Timwah Luk, Scarborough, both of Me.

[73] Assignee: Fairchild Semiconductor Corporation, Santa Clara, Calif.

[21] Appl. No.: 221,322

[22] Filed: Jul. 19, 1988

[51] Int. Cl.[4] .............................................. H03F 3/45
[52] U.S. Cl. .................................... 330/256; 330/289
[58] Field of Search ...................... 307/455, 467, 491; 330/143, 256, 289, 307

[56] References Cited

U.S. PATENT DOCUMENTS 4,207,538  6/1980  Goel ................................ 330/289 X
4,757,273  7/1988  Bray .................................... 330/256

Primary Examiner—Steven Mottola
Attorney, Agent, or Firm—Lee Patch; Mark A. Aaker; Daniel H. Kane, Jr.

[57] ABSTRACT

A temperature compensated ECL gate (20) with each gate circuit resistance formed by a pair of opposite polarity temperature coefficient resistors. A first gate transistor element (Q1) and a second gate transistor element (Q2) coupled at a common emitter coupling (12) provide alternative collector current paths from high potential ($V_{cc}$) through a first gate transistor collector path with collector resistance (R11,R12) and a gate transistor collector path with collector resistance (R21,R22). A current source transistor element (Q3) is coupled between the common emitter coupling (12) of the gate transistor elements and low potential ($V_{EE}$) through current source resistance (R31,R32). The resistances of the ECL gate each include a positive temperature coefficient silicon first resistor (R11,R21,R31) and a negative temperature coefficient low capacitance polysilicon second resistor coupled (R12,R22,R32) in series. The sum of the resistances of the first and second resistors is selected to providing the respective circuit resistance of the ECL gate and the ratio of the resistances of the first and second resistors is selected according to the temperture characteristics of the current source voltage generator and the temperature characteristics of the first and second resistors for substantial temperature compensation of the gate current and signal voltage swing over a specified temperature range. The temperature compensating pair of opposite polarity temperature coefficient resistors is also applicable for temperature compensation at active nodes of TTL and STL circuits.

14 Claims, 3 Drawing Sheets

TEMPERATURE COMPENSATED BIPOLAR CIRCUITS

TECHNICAL FIELD

This invention relates to bipolar technology circuits and gates with improved temperature compensation. In particular the invention provides ECL gates with improved temperature compensation for the total gate current and signal swing voltage without substantially increasing parasitic capacitance of the ECL gate. More generally, the invention is applicable for temperature compensation in any bipolar technology such as transistor logic (TTL) and Schottky transistor logic (STL) circuit applications to provide flat or stable switching speed at active nodes across a specified temperature range.

BACKGROUND ART

A typical ECL gate 10, illustrated in FIG. 1, includes a pair of gate transistors Q1 and Q2 forming an input transistor Q1 and a reference transistor Q2 with common emitter coupling at node 12. The gate transistors Q1 and Q2 provide alternative current paths through respective collector resistors or swing voltage resistors R1 and R2 from high potential $V_{cc}$. An ECL current source transistor Q3 is coupled between the common emitter coupling node 12 and low potential $V_{EE}$ through current source resistor or tail resistor R3. In this example, the ECL gate resistances R1, R2 and R3 are equal. Current source Q3 generates gate current in the alternative current paths according to the input signal $V_{IN}$ at the base of input transistor Q1. A bias voltage generator also known as a current source voltage generator or reference voltage generator not shown provides the reference voltage $V_{BB}$ applied at the base of reference transistor Q2 and the current source voltage $V_{cs}$ applied at the base of the current source transistor Q3. Typical ECL gates also include the differential signal input configuration in which the gate transistors constitute differential input transistors for differential inputs $V_{IN}$ and $\overline{V_{IN}}$ instead of an input transistor and reference transistor having inputs $V_{IN}$ and $V_{BB}$.

ECL circuits generally operate in the negative voltage range with the high potential level $V_{cc}$ for example at ground potential and low potential $V_{EE}$ for example at $-5.0$ volts. Alternatively if $V_{cc}$ is set at $+5.0$ volts then low potential $V_{EE}$ may be set at ground potential. In the negative voltage range the reference voltage level $V_{BB}$ is referenced to high potential $V_{cc}$ and set for example in the range of $-1.2$ to $-2.0$ volts. The logic high and low level voltage signals are set on either side of the reference voltage. For example with a reference voltage of $-1.2$ volts the signal voltage swings between a high level voltage signal in the range of for example $-0.8$ volts and a low level voltage signal in the range of for example $-1.6$ volts. For a reference voltage $V_{BB}$ of for example $-2.0$ volts the signal voltage may swing between for example $-1.6$ volts and $-2.4$ volts.

The current source transistor Q3 is base driven by the current source voltage $V_{cs}$ derived from the separate bias voltage generator or current source voltage generator, not shown. The current source voltage $V_{cs}$ may have a variety of different temperature characteristics according to the type of generator used. The current source transistor Q3 in cooperation with the current source voltage generator generates the ECL gate current or tail current through current source resistor R3. The gate current passes through either of the alternative transistor collector paths, that is, through resistor R1 or resistor R2, according to the high or low level voltage input signal $V_{IN}$ applied to the base of input transistor Q1. Complementary ECL gate output signals may be taken from the collectors respectively of input transistor Q1 and reference transistor Q2 and the output signal voltage swing is set by the swing resistors R1 and R2 and the gate current.

On a typical bipolar process integrated circuit chip the ECL gate resistors are formed from doped silicon and have a positive temperature coefficient. Therefore as the temperature increases so does the value of the respective resistances, decreasing the gate current. If $V_{cs}$ is made to vary so that the gate current is constant, the signal voltage swing will increase significantly with higher temperature due to the positive temperature coefficient of the silicon resistors. This increase in the swing voltage results in slow down of the ECL gate at higher temperatures. Slow down of the ECL gate may also occur at low temperatures because the resistance of silicon base resistors at typical doping levels also increases as temperature falls below room temperature.

In order to maintain a relatively constant signal swing voltage, $V_{cs}$ must vary negatively with increasing temperature in the same manner as the base emitter voltage drop $V_{BE}$ varies. The objective is to stabilize the tail voltage V'. According to this prior art arrangement the gate current decreases with increasing temperature. As noted above, this reduction in gate current tends to slow down the operation of the ECL gate.

According to one prior art approach using silicon base resistor technology, temperature compensation is provided by adjusting the temperature coefficient of the voltage generator output. This compensation can be arranged to achieve either a constant gate current $I_{tail}$ or constant signal voltage swing but not both. However, undesirable parasitic capacitance is introduced. The typical silicon resistor consists of a portion of the epitaxial silicon layer doped for example with P-type silicon during the base implant step. This silicon resistor, referred to as the base resistor, overlies the N-type silicon buried layer. The N-type silicon buried layer in turn overlies the P-type silicon substrate of the integrated circuit die. The silicon resistor is therefore capacitively coupled to the substrate through two PN junction capacitors. This parasitic capacitance results in high power dissipation by the compensated ECL gate.

A secondary effect is also associated with conventional temperature compensating methods using base resistors. While the base resistors of P-type silicon start out with high capacitance, this capacitive coupling to the substrate increases with temperature slowing down the operation of the gate even more.

According to prior art polysilicon resistor technology, the same method adjustment of the voltage generator output is also subject to limitations. The prior art polyresistor network can provide only constant gate current or constant voltage swing but not both.

An attempt was made by the present inventors to substitute low capacitance and low capacitive coupling resistor structures for the prior art ECL gate silicon resistances in temperature compensated silicon resistor networks, using resistor materials with negative temperature coefficient. For example polysilicon resistors used in polysilicon bipolar fabrication processes have much lower parasitic capacitance for higher speed operation of the ECL gate. However the temperature characteristic or coefficient of polysilicon resistor structures is negative. As temperature increases the resistance decreases and the gate current increases. This may lead to even higher temperatures, lower resistances and higher gate current. The positive feedback divergence may lead to "thermal runaway." Even if the IC package is constructed with adequate heat dissipation to control thermal runaway, power dissipation nevertheless increases at high temperatures and high junction temperatures effect the reliability of the device.

OBJECTS OF THE INVENTION

It is therefore an object of the present invention to provide temperature compensation for both swing voltage and tail current for ECL gates without substantially increasing parasitic capacitance and thus without substantially increasing power dissipation in the ECL gate circuit.

Another object of the invention is to provide temperature compensation in integrated circuit ECL gates incorporating resistor materials with negative temperature coefficients but without incurring the risks of thermal runaway.

A further object of the invention is to reduce the parasitic capacitance and accompanying power dissipation in the temperature compensation of ECL gate integrated circuits by incorporating low capacitance negative temperature coefficient resistance materials, and in addition to offset the effects of the negative temperature coefficient materials.

More generally, the object of the invention is to provide temperature compensation in any bipolar technology circuits and gates to provide flat and stable switching speeds at active nodes over a desired temperature range.

DISCLOSURE OF THE INVENTION

In order to accomplish these results the present invention provides temperature compensated bipolar circuits including ECL, TTL and STL circuits in which the active node circuit resistances are each composed of a pair of opposite polarity temperature coefficient resistors. The opposite polarity temperature coefficient resistors are coupled in series and are selected to provide the specified total resistance of the respective active node circuit resistance while providing substantial temperature compensation for the switching speed over a specified temperature range. In the preferred example embodiment each pair of opposite polarity temperature coefficient resistors includes a silicon resistor and a polysilicon resistor having relatively low capacitance for temperature compensation without substantially increasing power dissipation.

More specifically a temperature compensated ECL gate according to the invention typically includes a first gate transistor element and a second gate transistor element coupled at a common emitter coupling or node providing alternative collector current paths from high potential. The alternative collector current paths are the first gate transistor collector path with collector resistance and the second gate transistor collector path with collector resistance. A current source transistor element is coupled between the common emitter coupling of the gate transistor elements and low potential through the current source or tail resistance. The current source, base driven by current source voltage from a bias voltage generator, generates gate current through the alternative gate transistor collector current paths according to signals applied at the base of the gate transistor elements. The ECL gate provides output signals at the collectors of the gate transistors with signal swing voltage between high and low logic levels. The gate transistors may be either an input transistor and reference transistor with inputs $V_{IN}$ and $V_{BB}$ or differential input transistors with inputs $V_{IN}$ and $\overline{V}_{IN}$.

According to the invention each of the resistances of the ECL gate, namely the collector resistances and the current source resistance, is comprised of a positive temperature coefficient first resistor and a negative temperature coefficient second resistor coupled in series. The second resistor is selected to have relatively low capacitance, that is relatively low resistor to substrate capacitance coupling in the case of integrated circuits. The sum of the resistances of the first and second resistors is selected to provide the selected circuit resistance of the ECL gate. The ratio of the resistances is selected according to the temperature characteristics of the current source voltage generator and the temperature characteristics of the two types of resistors for substantial temperature compensation of the gate current and signal swing voltage over the specified temperature range.

A negative temperature coefficient polysilicon resistor is selected as a component of each of the ECL gate circuit resistances because of its low parasitic capacitance and low power dissipation requirements. The negative temperature coefficient of the polysilicon resistor of each pair is then offset by the positive temperature coefficient base resistor. In the preferred embodiment the silicon first resistor and polysilicon second resistor are arranged so that the polysilicon second resistor is interposed between the silicon first resistor and respective active element transistor further reducing the effect of any parasitic capacitance.

The programmed temperature coefficient pair of resistors according to the invention may also be substituted for resistances at the active nodes of TTL and STL circuits to provide flat, even or stable speed over a desired temperature range.

Other objects, features and advantages of the invention are apparent in the following specification and accompanying drawings.

DESCRIPTION OF PREFERRED EXAMPLE EMBODIMENTS & BEST MODE OF THE INVENTION

Figure 1:
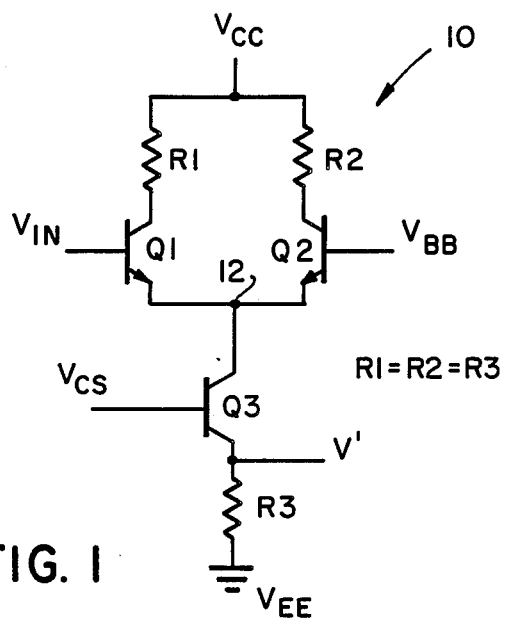
FIG. 1 is a schematic diagram of a typical prior art ECL gate.
Figure 2:
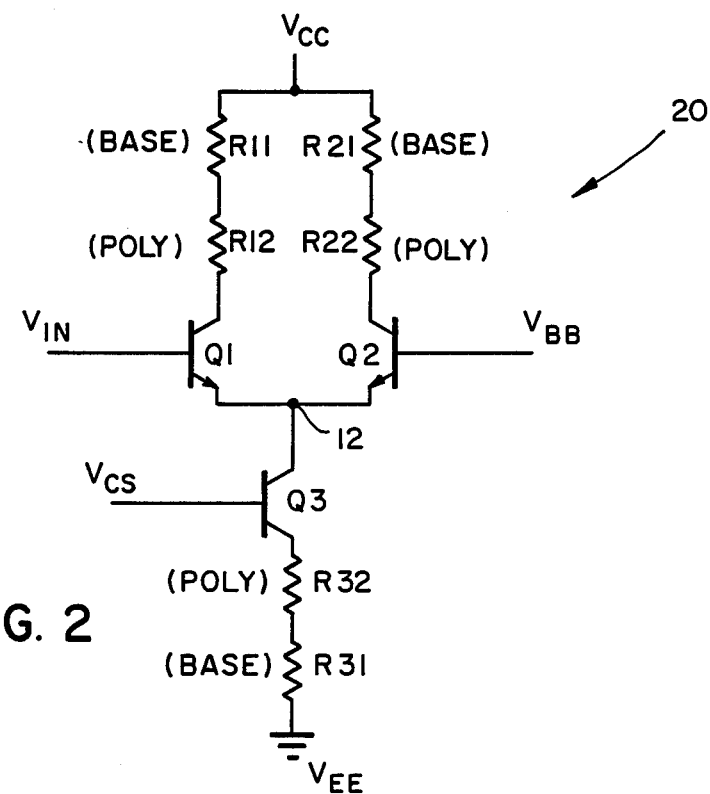
FIG. 2 is a schematic diagram of a temperature compensated ECL gate in accordance with the present invention.

A temperature compensated ECL gate 20 according to the invention is illustrated in FIG. 2. Components performing substantially the same function as in the ECL gate of FIG. 1 are indicated by the same reference designations. In the temperature compensated ECL gate of FIG. 2, however, each of the ECL gate resistances R1,R2 and R3 of the circuit of FIG. 1 is replaced by a pair of resistors including a silicon resistor such as a P-type silicon base resistor and a polysilicon resistor which can be either P-type or N-type polysilicon resistors. Thus, the collector resistance for input transistor Q1 consists of the base resistor R11 and poly resistor R12 connected in series. The collector resistance for reference transistor Q2 consists of base resistor R21 and poly resistor R22 connected in series while the tail resistance for current source transistor Q3 consists of series connected base resistor R31 and poly resistor R32.

Figure 3:
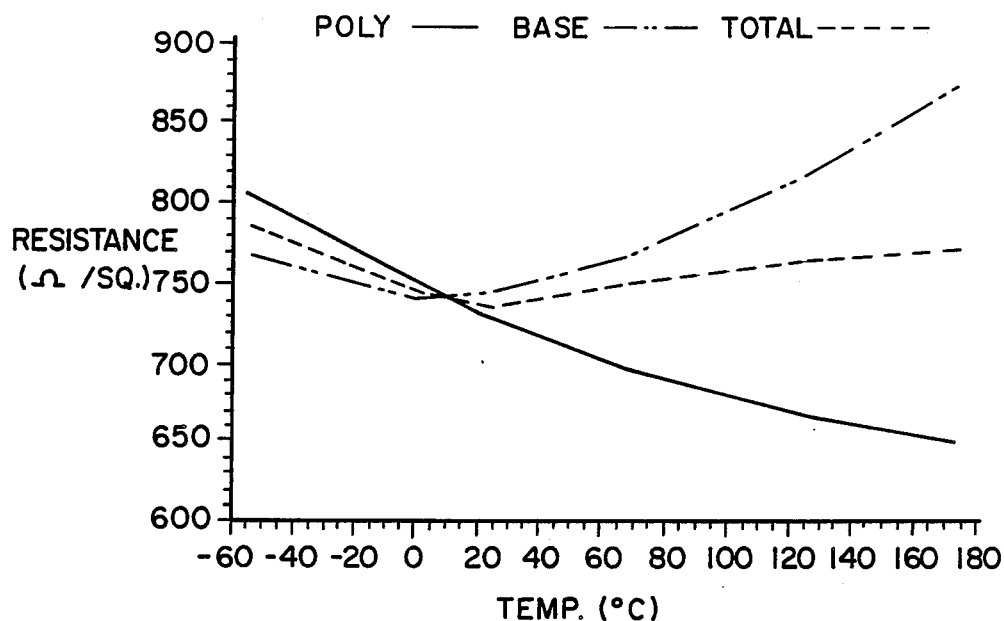
FIG. 3 is a graph comparing the variation in resistance with temperature for a single polysilicon resistor, a single silicon base resistor, and combined polysilicon and base resistors having substantially the same total resistance.
Figure 4:
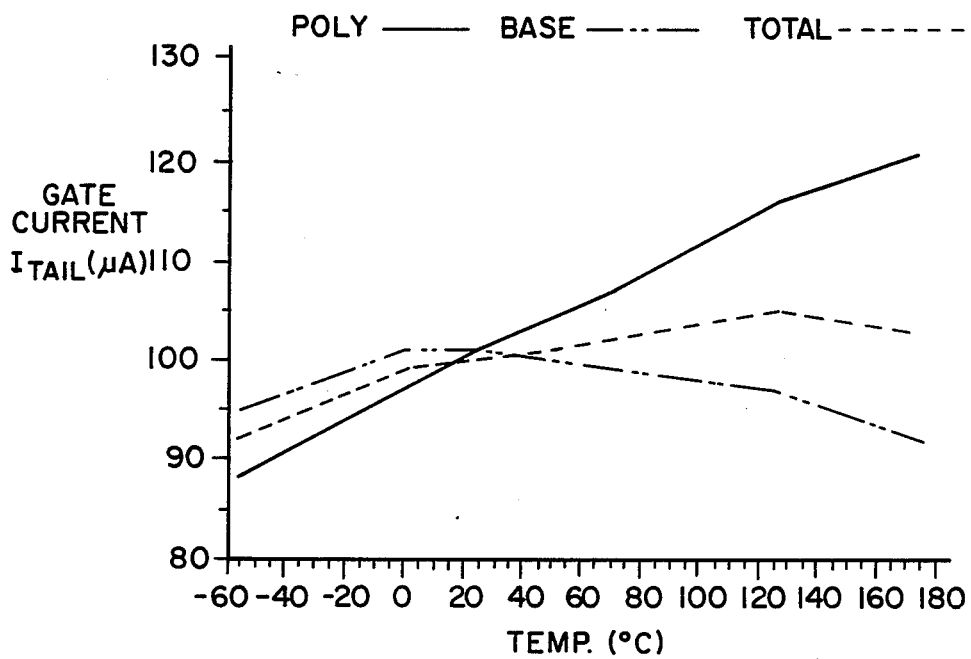
FIG. 4 is a graph of variation in gate current with variation in temperature for an ECL gate having circuit resistances corresponding to the three types of circuit resistance corresponding to the graph of FIG. 3.

In each resistor pair, the poly resistor in comparison with the base resistor, is characterized by much lower parasitic capacitance as hereafter described, and a temperature coefficient that is negative. The comparative temperature coefficient characteristics of a base resistor alone, a poly resistor alone, and a combination of base resistor and poly resistor with substantially the same total resistance is illustrated in the example of FIGS. 3 and 4. In this particular example, the conventional base resistor with a resistance of approximately 740 ohms/square ($\Omega$/sq.) at approximately 10° C. (50° F.) and a positive temperature coefficient, increases in resistance with increasing temperature. In the temperature range from 10° C. to 180° C. the resistance increases over the range from 740$\Omega$/sq. to approximately 880$\Omega$/sq. It is noted that the base resistor resistance also increases slightly as the temperature drops below 10° C. With a base resistor having this characteristic parameter for each of the ECL gate resistances R1,R2 and R3 of FIG. 1, the corresponding gate current or tail current $I_{tail}$ through resistor R3 is shown in FIG. 4 decreasing over the temperature range from 10° C. to 180° C.

The poly resistor of substantially the same resistance at 10° C. but with negative temperature coefficient is characterized by a resistance decrease in the range from 800$\Omega$/sq. to 650$\Omega$/sq. as the temperature increases from −60° C. to 180° C. as shown in FIG. 3. Using a single resistor having these characteristic parameters for each of the ECL gate resistances R1,R2 and R3 of FIG. 1, the corresponding gate current or tail current $I_{tail}$ through resistor R3 is shown in FIG. 4 increasing substantially over the specified temperature range with the possibility of "thermal runaway."

The characteristics of an example resistance provided by series coupled base and poly resistors according to the invention with substantially the same total resistance as R1,R2 or R3 is shown by the dashed line in FIGS. 3 and 4. With the base resistor selected by way of example to provide 54% of the total resistance and the poly resistor selected to provide 46% of the total resistance, the total resistance is substantially temperature compensated at approximately 750$\Omega$/sq. throughout the specified temperature range from at least 10° C. to 180° C. With the pair of resistors as characterized by the dashed line of FIG. 3 used for each of the resistor pairs R11,R12 and R21,R22 and R31,R32 in the ECL gate of FIG. 2, the gate current or tail current $I_{tail}$ through current source resistors R31,R32 is shown in FIG. 4. Substantial temperature compensation is provided by the resistor pair having temperature coefficients of opposite polarity and the gate current is substantially stable over the temperature range from 10° C. to 180° C. Resistance combinations to provide any desired temperature compensation characteristics can be constructed according to the invention, and the foregoing example is presented by way of illustration only.

Figure 5:
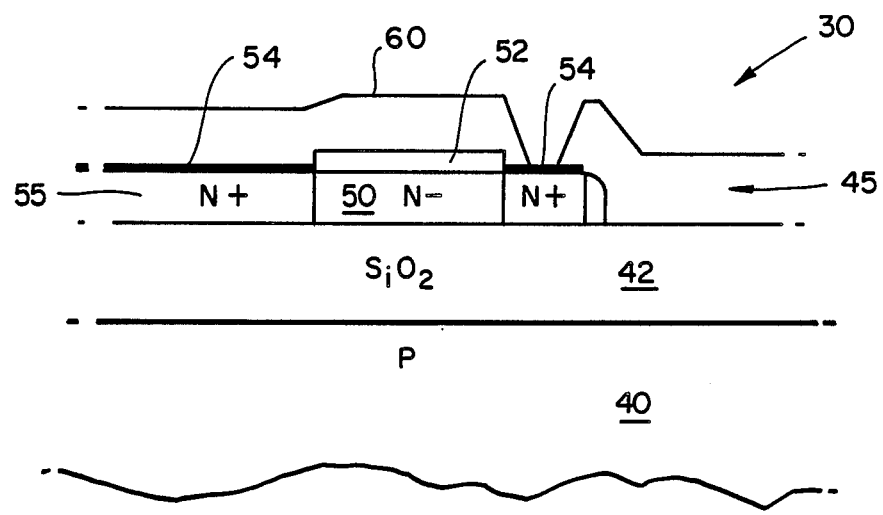
FIG. 5 is a diagrammatic side view of an integrated circuit polysilicon resistor suitable for use in the temperature compensated ECL gate.

An integrated circuit polysilicon resistor suitable for use in a temperature compensated ECL gate according to the invention is illustrated in FIG. 5. The polysilicon integrated circuit structure 30 is fabricated according to a bipolar modified isoplanar process such as described for example in U.S. patent application Ser. No. 940,573 filed Dec. 11, 1986 entitled ENHANCED DENSITY MODIFIED ISOPLANAR PROCESS abandoned in favor of U.S. FWC continuation patent application Ser. No. 265,301 filed Oct. 27, 1988, under the same title. The polysilicon resistor structure is fabricated on a P-type silicon substrate 40 on which has been grown an N-type epitaxial silicon layer. The epitaxial silicon layer is divided into epitaxial islands by isolation oxide regions 42 and the polysilicon resistor structure is formed over the spacer or isolation oxide 42. A portion 50 of the polysilicon layer 45 is doped with an N− concentration or P− concentration of impurities. The high resistance N− or P− concentration polysilicon region 50 forms the resistor with higher conductivity N+ or P+ concentration polysilicon on either side to provide electrical leads. An oxide cap 52 protects the high resistance polysilicon region 50 which forms the polysilicon resistor. The higher conductance N+ or P+ polysilicon regions are covered by silicide 54 for surface contact locations. Dielectric masking layer 60 is used to form metal contacts. The electrical interconnect region 55 of the polysilicon layer can provide electrical lead interconnection for example to a series coupled P-type silicon base resistor at the level of the epitaxial layer in accordance with the invention.

A feature and advantage of the polysilicon resistor is that direct capacitive coupling to the substrate is eliminated by the oxide spacer layer greatly reducing parasitic capacitance in comparison with a silicon base implant resistor. The base epitaxial silicon resistor is characterized by direct capacitor coupling PN junctions between the resistor and buried collector layer and between the buried collector layer and substrate.

While the invention has been described with reference to particular example embodiments using ECL gates with input and reference gate transistors with base inputs $V_{IN}$ and $V_{BB}$, the invention is also applicable to ECL gates with differential input gate transistors with base inputs $V_{IN}$ and $\overline{V}_{IN}$.

More generally, the invention is applicable to any bipolar technology circuit applications such as TTL and STL circuits and gates. The resistance of a component at an active node is replaced with two resistors according to the invention having opposite polarity temperature coefficients such as a silicon base resistor and a polysilicon resistor. The combination is designed to yield the desired composite temperature coefficient to maintain even, flat, or stable switching speed at the active node taking into account variable $V_{BE}$'S at base emitter junctions associated with the active node. For example in TTL circuits the pullup resistors and phase splitter resistors at pullup and phase splitter transistor collectors are replaced with resistor pairs in accordance with the invention and in STL circuits any bias resistors are replaced with the desired combination of a pair of resistors of opposite polarity temperature coefficients. As set forth in the examples above, in ECL circuits any swing resistors are replaced with the desired programmed temperature coefficient combination of base resistor and polysilicon resistor.

In each case, the present invention provides the primary benefit of a programmed temperature coefficient that yields the desired speed characteristics and the secondary benefit of decreased total capacitance. The invention is intended to cover all modifications and equivalents within the scope of the following claims.

We claim:

1. In A temperature compensated bipolar technology circuit comprising active nodes switching between high and low potential, and active node circuit transistor elements and circuit resistances, the improvement comprising:

each active node circuit resistance comprising a pair of opposite polarity temperature coefficient resistors effectively forming a single functional active node circuit resistance, said pair of opposite temperature coefficient resistors being selected to provide the specified total resistance of the respective active node circuit resistance while substantially temperature compensating and stabilizing the active node during switching over a specified temperature range.

2. The temperature compensated bipolar technology circuit of claim 1 wherein the resistors of a pair of opposite polarity temperature coefficient resistors forming an active node circuit resistance are a silicon first resistor and a polysilicon second resistor, said second resistor having relatively low capacitance for temperature compensation without substantially increasing power dissipation.

3. A temperature compensated ECL gate having integrated circuit active node transistor elements and resistances for generating gate current through alternative circuit transistor element collector current paths according to ECL gate input signals and for providing ECL gate output signals with output signal swing voltage between high and low logic levels, the improvement comprising:

said integrated circuit active node resistances of the ECL gate each comprising at least a pair of resistors including a positive temperature coefficient first resistor and a negative temperature coefficient second resistor coupled in series, said second resistor having relatively low capacitance for temperature compensation of said gate current and signal swing voltage without substantial increase in power dissipation.

4. The temperature compensated ECL gate of claim 3 wherein the first and second resistors of each pair respectively comprise a silicon resistor and a polysilicon resistor, the silicon and polysilicon resistors of a pair being selected to provide substantially the total resistance for the respective active node resistance while providing substantial temperature compensation for said gate current and signal swing voltage over a specified temperature range.

5. The temperature compensated ECL gate of claim 4 wherein the first and second resistors of a pair are arranged so that the second resistor is interposed between the first resistor and a respective active node transistor element thereby further reducing effects of parasitic capacitance.

6. The temperature compensated ECL gate of claim 3 wherein the first and second resistors of each pair are selected to provide substantially constant gate current over the desired temperature range.

7. A temperature compensated ECL gate having a pair of gate transistor elements with common emitter coupling providing alternative collector paths from high potential with collector path resistance in each collector path, one of said transistor elements comprising an ECL gate input transistor element, a current source coupled at the common emitter coupling of the gate transistor elements with current source resistance, said current source being operative with a current source voltage generator for generating gate current through the alternative collector current paths according to the input signal at the ECL gate input transistor element and for providing ECL gate output signals with output signal swing voltage between high and low logic levels, the improvement comprising:

at least one of said current source resistance and collector path resistances comprise a positive temperature coefficient silicon first resistor and a negative temperature coefficient polysilicon second resistor coupled in series, said first and second resistors being selected to provide a specified total resistance and to provide substantial temperature compensation for the gate current and signal swing voltage over a specified temperature range without substantially increasing power dissipation by the ECL gate.

8. The temperature compensated ECL gate of claim 7 wherein the first and second resistors forming a collector path resistance are arranged so that the polysilicon second resistor is interposed between the silicon first resistor and the respective gate transistor and wherein the first and second resistors forming a current source resistance are arranged so that the polysilicon second resistor is interposed between the silicon first resistor and the current source.

9. The temperature compensated ECL gate of claim 8 wherein the polysilicon second resistor comprises a portion of an integrated circuit polysilicon layer overlying an oxide spacer layer in turn overlying the substrate of the integrated circuit thereby reducing the polysilicon layer resistor to substrate capacitance.

10. The temperature compensated ECL gate of claim 9 wherein the current source comprises a current source transistor element with current source resistance coupled between the current source transistor emitter and low potential.

11. A temperature compensated ECL gate comprising a first gate transistor element and a second gate transistor element coupled at a common emitter coupling providing alternative collector current paths from high potential through the first gate transistor collector path with collector path resistance and the second gate transistor collector path with collector path resistance, a current source transistor element coupled between the common emitter coupling of the gate transistor elements and low potential through current source resistance, said current source being operative with a current source voltage generator to generate a gate current through the alternative gate transistor collector current paths according to input signals applied at a base of a gate transistor element, said ECL gate providing output signals with signal swing voltage between high and low logic levels, the improvement comprising:

said collector path and current source resistances of the ECL gate each comprising a positive temperature coefficient first resistor and a negative temperature coefficient second resistor coupled in series, said second resistor having relatively low capacitance, the first and second resistors being selected for providing the respective resistance of the ECL gate and said first and second resistors being selected according to the temperature characteristics of said first and second resistors and the temperature characteristics of the current source voltage generator with which the ECL gate is used for substantial temperature compensation of the gate current and signal swing voltage over a specified temperature range.

12. The temperature compensated ECL gate of claim 11 wherein said resistances of the ECL gate each comprise an integrated circuit silicon first resistor and an integrated circuit polysilicon second resistor having relatively low capacitance.

13. The temperature compensated ECL gate of claim 12 wherein the integrated circuit polysilicon second resistor comprises a portion of a polysilicon layer overlying an oxide spacer layer in turn overlying the integrated circuit substrate thereby reducing resistor to substrate capacitance.

14. The temperature compensated ECL gate of claim 13 wherein the first and second resistors forming each collector path resistance are arranged so that the polysilicon second resistor is interposed between the silicon first resistor and the respective gate transistor element and wherein the first and second resistors forming the current source resistance are arranged so that the polysilicon second resistor is interposed between the silicon first resistor and the current source transistor element.

* * * * *